US011366505B2

(12) United States Patent
Badrieh et al.

(10) Patent No.: US 11,366,505 B2
(45) Date of Patent: Jun. 21, 2022

(54) PREDICTIVE POWER MANAGEMENT

(71) Applicant: Micron Technology, Inc., Boise, ID (US)

(72) Inventors: Fuad Badrieh, Boise, ID (US); Baekkyu Choi, San Jose, CA (US); Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 206 days.

(21) Appl. No.: 16/369,804

(22) Filed: Mar. 29, 2019

(65) Prior Publication Data

US 2020/0310520 A1  Oct. 1, 2020

(51) Int. Cl.
*G06F 1/3225* (2019.01)
*G06F 1/3234* (2019.01)
*G06F 3/06* (2006.01)

(52) U.S. Cl.
CPC .......... *G06F 1/3225* (2013.01); *G06F 1/3275* (2013.01); *G06F 3/0625* (2013.01); *G06F 3/0634* (2013.01); *G06F 3/0659* (2013.01); *G06F 3/0671* (2013.01)

(58) Field of Classification Search
CPC .... G06F 1/3225; G06F 1/3275; G06F 3/0625; G06F 3/0634; G06F 3/0659; G06F 3/0671
See application file for complete search history.

(56) References Cited

U.S. PATENT DOCUMENTS

| | | | |
|---|---|---|---|
| 8,513,974 B1 * | 8/2013 | Van Dyken | H03K 19/0016 326/38 |
| 9,189,053 B2 | 11/2015 | Cui et al. | |
| 9,748,934 B1 * | 8/2017 | Oh | H03K 19/00346 |
| 2009/0072885 A1 * | 3/2009 | Kawasaki | G06F 1/3237 327/519 |
| 2009/0172442 A1 | 7/2009 | Alexander et al. | |
| 2010/0115179 A1 | 5/2010 | Carr et al. | |
| 2010/0229021 A1 | 9/2010 | Konstadinidis et al. | |
| 2010/0332858 A1 | 12/2010 | Wilson et al. | |
| 2011/0043220 A1 * | 2/2011 | Leibowitz | G06F 1/26 324/613 |
| 2011/0320839 A1 | 12/2011 | David et al. | |
| 2012/0007669 A1 * | 1/2012 | Chen | H01L 23/64 327/564 |
| 2012/0159226 A1 * | 6/2012 | Prathaban | G06F 1/28 713/340 |

(Continued)

OTHER PUBLICATIONS

ISA/KR, International Search Report and Written Opinion of the International Searching Authority, Int'l. Appl. No. PCT/US20/22042, dated Jul. 2, 2020, Korean Intellectual Property Office, Seo-gu, Daejeon, Republic of Korea, 15 pgs.

*Primary Examiner* — Jaweed A Abbaszadeh
*Assistant Examiner* — Hyun Soo Kim
(74) *Attorney, Agent, or Firm* — Holland & Hart LLP

(57) ABSTRACT

Methods, systems, and devices for predictive power management are described. Correlations may be identified between a set of commands performed at the memory device and oscillating voltage patterns, or a resonance frequency, or both. Voltages may be monitored by the memory device and be compared to the identified voltage pattern to mitigate undesirable oscillating voltages and resonance frequency.

21 Claims, 12 Drawing Sheets

(56) References Cited

U.S. PATENT DOCUMENTS

| | | | |
|---|---|---|---|
| 2014/0244947 A1* | 8/2014 | Song | G06F 13/1694 |
| | | | 711/154 |
| 2015/0089315 A1 | 3/2015 | Alcocer Ochoa et al. | |
| 2015/0309752 A1 | 10/2015 | Ellis et al. | |
| 2015/0316969 A1 | 11/2015 | Grunzke | |
| 2017/0030954 A1* | 2/2017 | Whatmough | G01R 23/07 |
| 2017/0329391 A1* | 11/2017 | Jaffari | G06F 1/08 |
| 2019/0064896 A1 | 2/2019 | Das et al. | |
| 2019/0278503 A1 | 9/2019 | Jayachandran et al. | |

\* cited by examiner

PREDICTIVE POWER MANAGEMENT

BACKGROUND

The following relates generally to a system that includes at least one memory device and more specifically to predictive power management Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

A power delivery network may provide power to a memory device and in doing so, may have to account for different factors and elements including feedback, circuit elements, time dependence, frequency dependence, and so forth. When the power delivery network operates close to or outside of acceptable ranges for the memory device, the memory device may perform sub-optimally with increased latency in performing commands or be subject to reliability issues.

DETAILED DESCRIPTION

Figure 1:
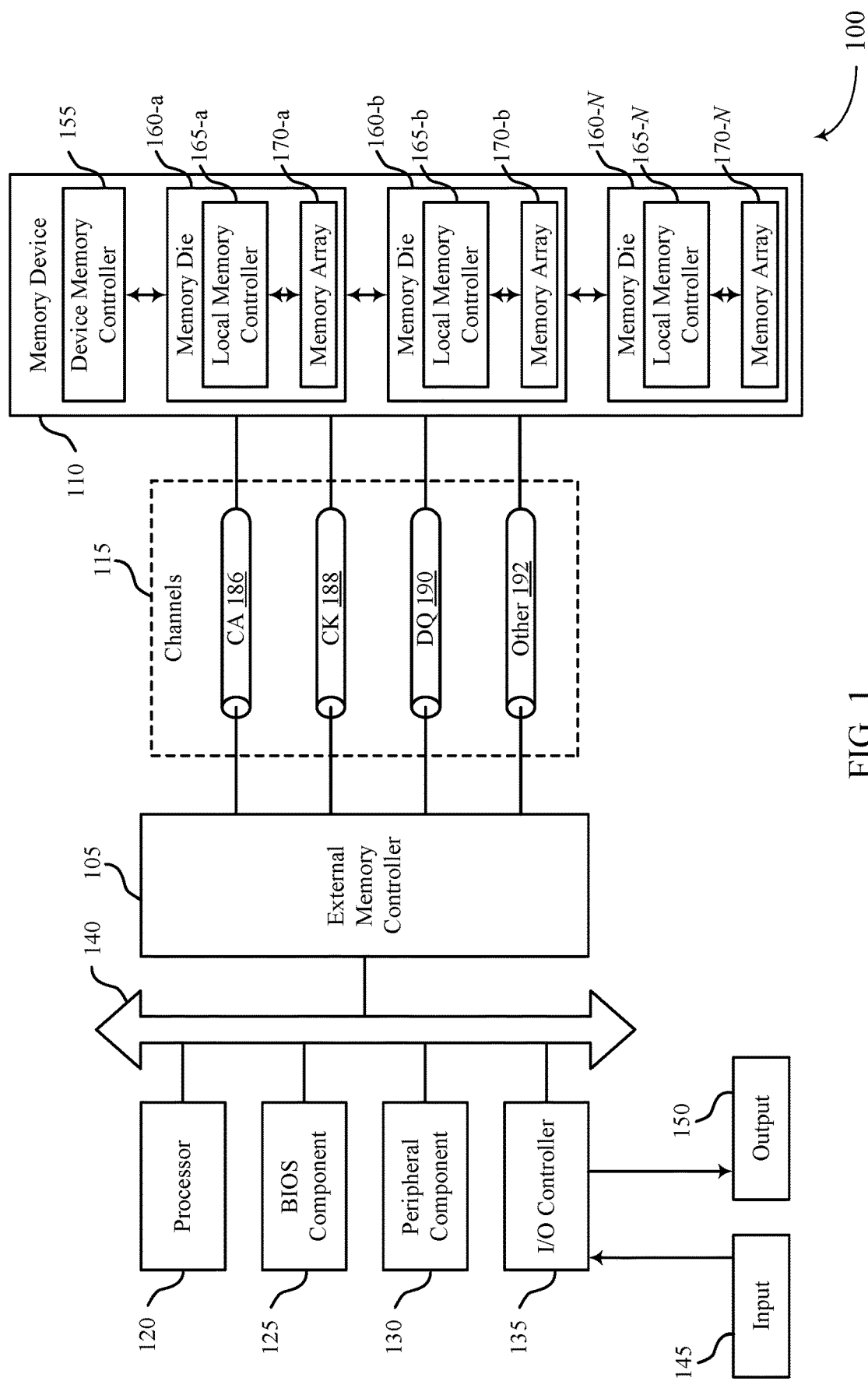
FIG. 1 illustrates an example of a system that supports predictive power management in accordance with examples as disclosed herein.

Memory devices may receive commands from a host device and may perform the commands accordingly. The memory device may draw current from the power delivery network when executing the commands. In some examples, the current demand may cause a voltage droop, a voltage to drop below the specification range of the memory device, the power deliver network to operate at a resonant frequency, voltages or currents of the power deliver network to oscillate, or a combination thereof. In some examples, the memory device may receive a set of commands or command timing that correspond to a specific current demand that results in undesirable voltage oscillating patterns, voltage droop, and in some cases the resonance frequency. A correlation between different set of commands and the undesirable oscillating patterns may be recognized, and as a result, the memory device may be able to predict upcoming command sequences that may trigger voltage droop and/or a resonance frequency.

Some memory devices may include a transistor (e.g., a DRAM transistor) which may have an impedance associated with it. The impedance may be frequency dependent, and frequency dependent elements may tend to behave differently for different time stimulus. In some examples of the power delivery network, a high impedance at or around a frequency or range of frequencies may cause the undesirable oscillating patterns or the resonance frequency, which may cause different parameters (e.g., voltage) to be outside of the specification ranges of the device and/or network.

In some examples, by identifying the impedance profile and the frequency range around which the resonance frequency may occur, the voltage response to the impedance profile and frequency range may be established. Further, the voltage response of the memory device may be monitored for unacceptable behavior (e.g., voltage droop, operating at resonant frequencies, etc.), which may be a result of command timing. Additionally or alternatively, the voltage response of the memory device may be monitored for an oscillating pattern which may be an indicator of trending toward the resonance frequency. After identifying either of these conditions, a timing of a command communicated to the memory device may be adjusted so that these conditions are mitigated or do not occur.

In some cases, one or more voltages of a power delivery network associated with a memory die may be monitored. The one or more voltages may be compared with a set of voltages of the power delivery network which may be indicative of the power delivery network operating at a specific frequency. A memory device or a host device may determine whether the one or more voltages satisfy a condition. A command timing associated with the memory die may be adjusted based on determining that that the one or more voltages satisfy the condition.

Features of the disclosure are initially described in the context of a memory system as described with reference to FIGS. 1 and 2. Features of the disclosure are described in the context of a power delivery network for a memory device and process flows as described with reference to FIGS. 3 through 6. These and other features of the disclosure are further illustrated by and described with reference to apparatus diagrams and flowcharts that relate to predictive power management for a memory device as described with reference to FIGS. 7 through 10.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card. In some examples, the host device may identify a set of voltages that may be indicative of the memory device operating at or near a resonance frequency. The set of voltages may be an oscillating set of voltages that establish a periodic pattern trending toward a droop voltage which may cause the memory device to operate sub-optimally.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some examples, an on-die monitoring component (e.g., an on-die oscilloscope) may dynamically calculate the spectrum of a memory device signal on the fly. The on-die component may be capable of reading transient waveforms which may provide frequency spectrum information. This frequency spectrum information may be compared to a predetermined lookup table and used to identify a resonance frequency before it occurs.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like. In some examples, a memory device controller may identify a periodic pattern or oscillating voltage that may be trending towards a droop voltage. The controller may then request new command signaling that may change the current demand, thus preventing the undesirable voltage oscillation and resonance frequency.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
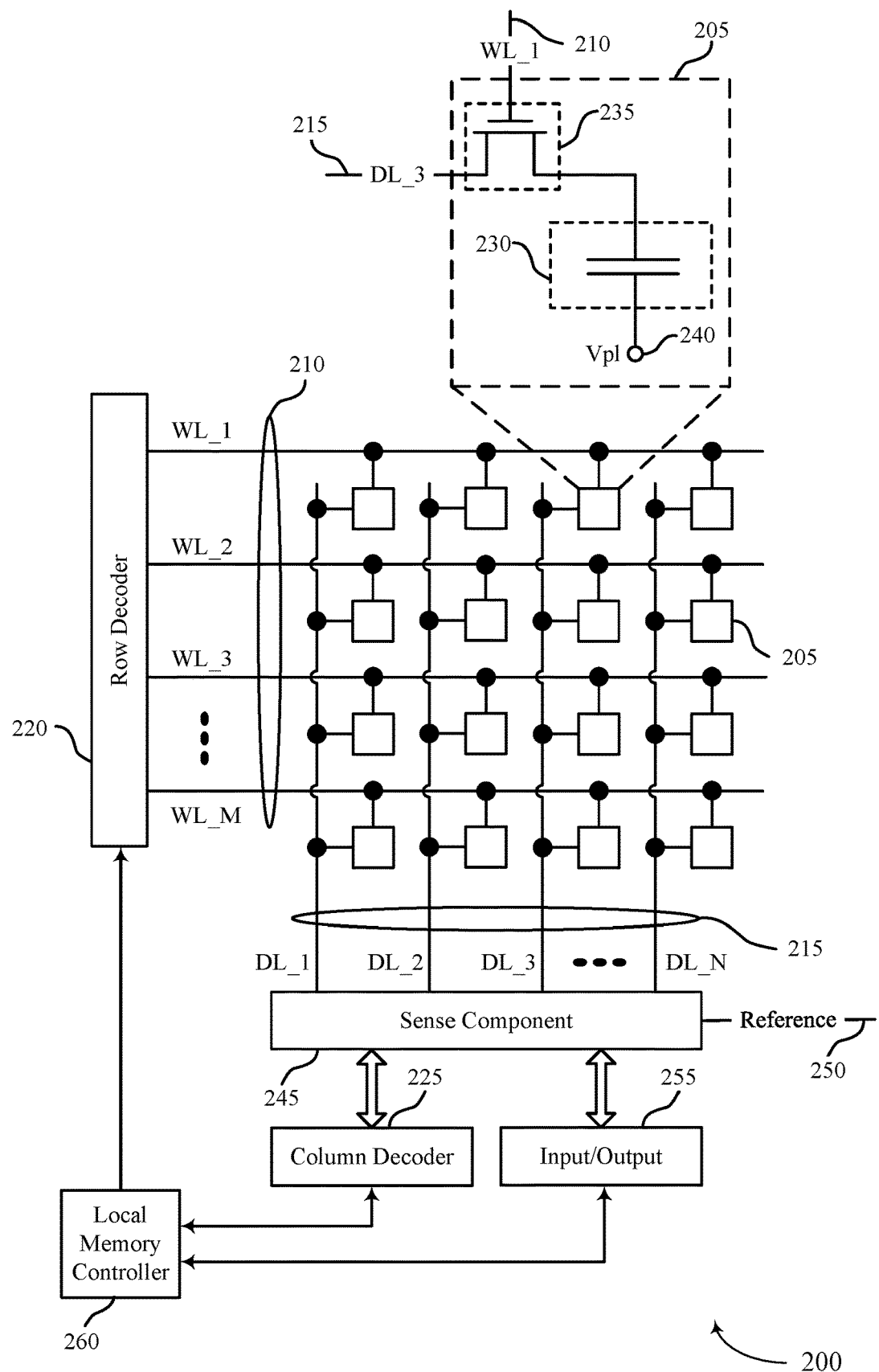
FIG. 2 illustrates an example of a memory die that supports predictive power management in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL N, where M and N depend on the size of the memory array. Thus, by activating a word line 210 and a digit line 215, e.g., WL_1 and DL 3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of the memory cell 205 may be provided as an output of the sense component 245 (e.g., to an input/output 255), and may indicate the detected logic state to another component of a memory device 110 that includes the memory die 200, such as a device memory controller 155 (e.g., directly or using the local memory controller 260).

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current described herein may be adjusted or varied and may be different for the various operations described in operating the memory die 200. In some examples, a memory device controller may identify a periodic pattern or oscillating voltage that may be trending towards a droop voltage. The controller may then request new command signaling that may change the current demand, thus preventing the undesirable voltage oscillation and resonance frequency.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
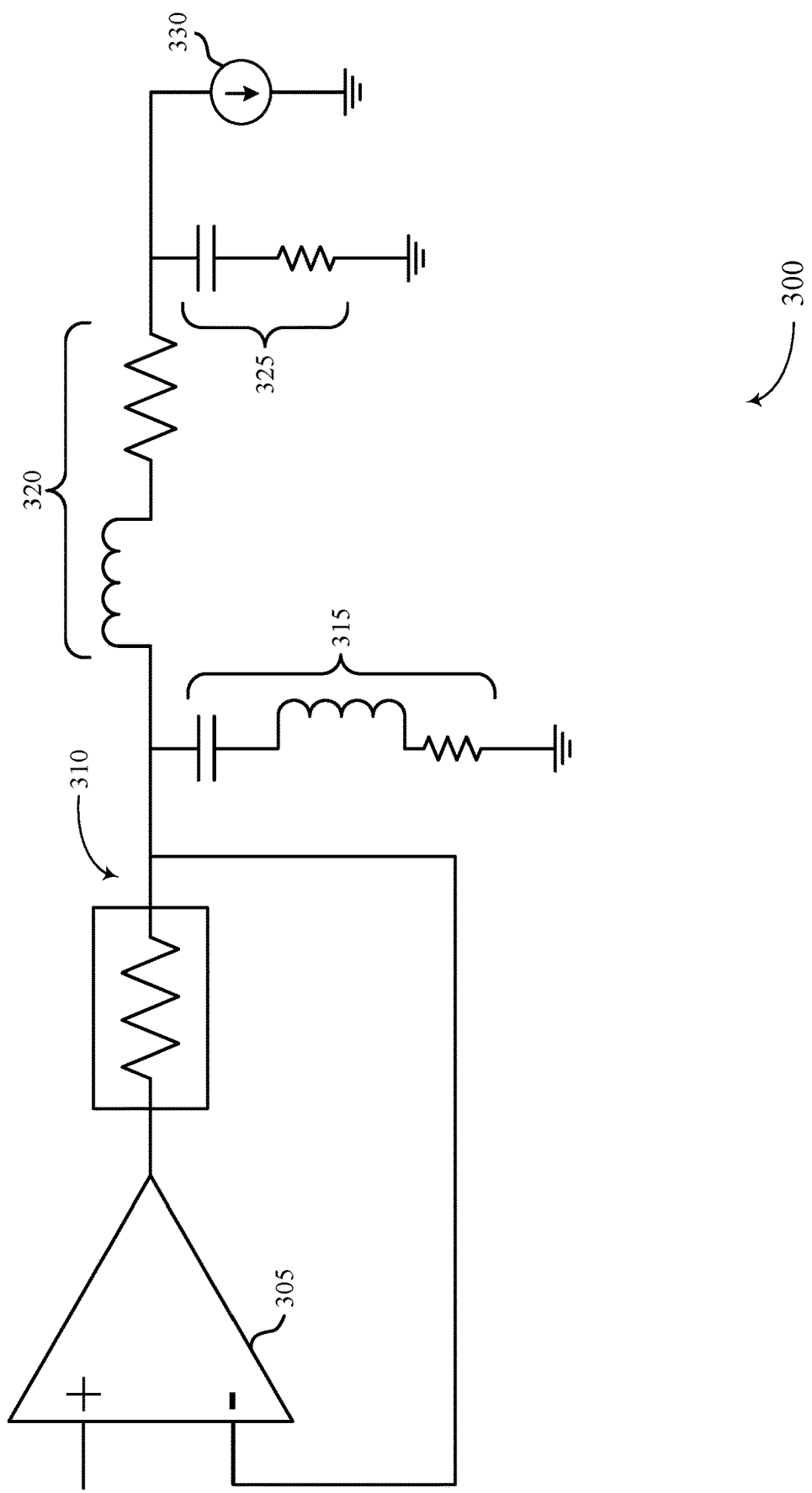
FIG. 3 illustrates an example of a power delivery network that supports predictive power management in accordance with examples as disclosed herein.

FIG. 3 illustrates an example of a power delivery network 300 that supports predictive power management for a memory device in accordance with examples as disclosed herein. The system 300 may include a printed circuit board (PCB) regulator 305, a sense point 310, representative impedance 315 associated with the PCB capacitors, representative impedance 320 associated with the package impedance, representative impedance associated with the die 325, and the die current 330. The representative impedance for the die 325 and the memory die current 330 may be a representative model of a memory die (not shown) which may be an example of memory die 200 as described with reference to FIGS. 1 and 2.

The power delivery network 300 may be an impedance model of a physical power delivery network and may include representative memory device elements. The power delivery network 300 may include elements such as, but not limited to, a voltage regulator, a PCB, interposers, the package encapsulating the memory die, the memory die, and so forth. In some examples, the power delivery network may include one or more voltage rails coupled with an array of memory cells and configured to delivery power to the array of memory cells. These physical elements of the power delivery network 300 may be modeled with a current source and some general and approximately equivalent impedance elements, as illustrated in FIG. 3. The equivalent impedance elements of FIG. 3 are shown as regulators, resistors, inductors, capacitors, and so forth and are examples of the relevant losses of a physical power delivery network.

Capacitors may be located on the PCB to stabilize voltage associated with the voltage regulator 305 and to hold such voltages associated with the voltage regulator 305 steady. In some cases, the PCB capacitors may have parasitics (which may be modeled with capacitors, inductors and resistors) associated with them and the PCB may additionally have parasitics (which may also be modeled with capacitors, inductors and resistors) associated with it. Additionally, the package encapsulated memory die may have impedance associated with it, which may be attributed to metals and vias and which may be modeled using inductors, capacitors, and resistors.

The PCB capacitor parasitics 315 may be illustrated and modeled as representative parasitic elements. The representative parasitic elements may be indicative of the impedance of the PCB capacitor parasitics and may be illustrated in FIG. 3 as a capacitor, an inductor, and a resistor. The package impedance 320 may be modeled with an inductor and resistor and the impedance of the die 325 may be modeled with a capacitor and resistor. The elements illustrated in FIG. 3 to represent the impedance of the power delivery network 300 are not limiting and any appropriate elements may be used to model the impedance of the power delivery network 300.

The voltage regulator 305 may be supplied with voltage and may increase and decrease the voltage depending on the power needed. Voltage regulator 305 may be a voltage control source with an output impedance and which may be monitored at a sense point 310. In some examples, the PCB capacitors may discharge (e.g., when voltage rail collapses), and the power delivery network may react with the voltage drooping or bouncing depending on the direction of the current. In this example, voltage regulator 305 may track sense point 310 and may adjust the output voltage to compensate for the voltage droop or bounce. The voltage droop or bounce may result in the operating voltage of the memory die to drop below or exceed the memory die voltage range, which may cause latency in memory operations and in some cases memory errors.

Figure 4:
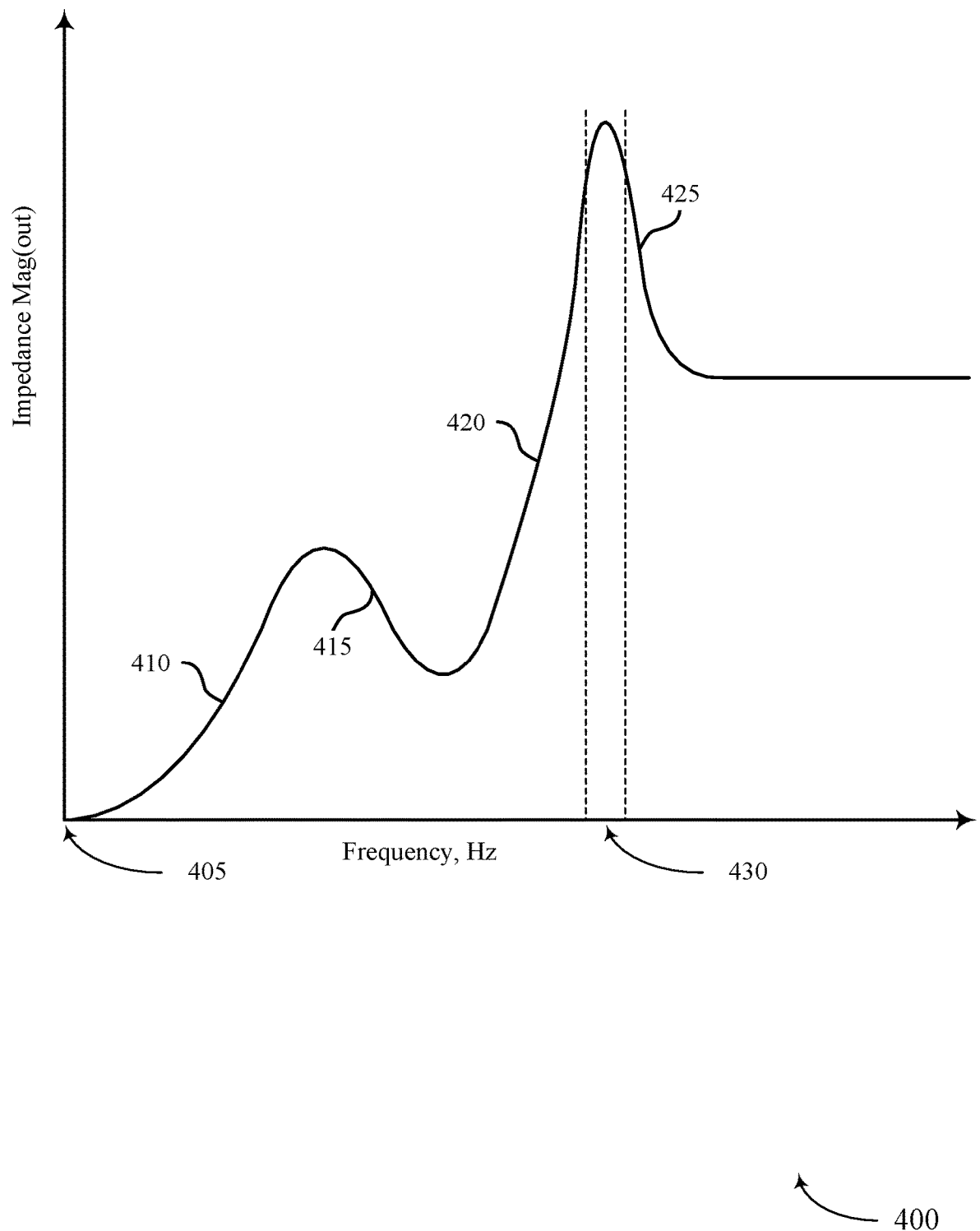
FIG. 4 illustrates an example of a diagram that supports predictive power management in accordance with examples as disclosed herein.

FIG. 4 illustrates an example of a diagram 400 that supports predictive power management for a memory device in accordance with examples as disclosed herein. The diagram 400 may be an example of an impedance curve from a voltage regulator to a memory device and illustrates the die side impedance. The representative impedance may include an impedance model of a memory die (not shown in FIG. 4) which may be an example of memory die 200 as described with reference to FIG. 2.

A power delivery network may be designed to minimize impedance for frequency independent impedance, and to maintain a steady state frequency such that the voltage drop between an ideal case and the memory die may be close to zero or a constant number. In some cases, for a physical power delivery network, the impedance may be a function of frequency. The diagram 400 illustrates one example of the frequency dependent behavior of impedance, and the frequency dependent behavior of impedance may be illustrated with any appropriate curve. Additionally, the inflection points, magnitude, and slope/rate may vary and may be dependent on the design of the power delivery network.

At lower frequencies and at 405, the impedance may be minimal as the voltage regulator may be able to address a significant portion of the direct current demand. As the frequency increases at 410, the gain of the voltage regulator performance may degrade and result in a higher effective impedance. Depending on the voltage regulator design, the regulation may become inefficient and the PCB capacitors may address the impedance at 415, thus the impedance may begin to decrease even though the frequency is increasing. The impedance of a capacitor may be represented as $1/2\pi fC$, in which $2\pi f$ or $\omega$ may be the frequency and C may be the capacitance. As a result, the impedance of the PCB capacitors may decrease the impedance as a function of frequency. However, the capacitors are not ideal, thus the impedance may not decrease to zero. Generally, capacitors may have intrinsic resistors and inductors associated with them due to the location on the PCB, thus, the impedance may decrease at 415, flatten out, and then begin to increase at 420 due to the inductive effects of the PCB capacitors and package.

At 420, the impedance curve may increase or go up partially due to the parasitic and inductive effects of the PCB capacitors, and also due to the package inductance and resistance. At 425, the impedance starts to decrease due to the memory die capacitors that address impedance in the higher frequencies ranging around and above the range of tens to hundreds of MHz. In practical applications, the memory die capacitors may not be ideal capacitors, thus there may be parasitic equivalent series resistance (ESR) and equivalent series inductance (ESL) associated with the memory die capacitors. ESR and ESL may be typical parasitics associated with power delivery networks.

Generally, higher impedance may not be desirable as it may cause voltage droop in power delivery on integrated circuits. In the example of FIG. 4, it may be desirable to alleviate the resonance around the range 430, which may be in the approximate range of and around tens of MHz (e.g., 20 MHz). In one example, the impedance may be reduced by adding more memory die capacitors or increasing the size of the capacitors on the memory die itself, but this may use more physical area on the PCB and may be impractical without any additional mitigating factors.

Higher impedances may increase the current demand which may cause voltage droop. When the voltage droops below the voltage specification of the memory die, or above the voltage specification of the memory die, it may cause the memory die to function at a sub-optimal level, which may introduce latency into memory operations or in some cases memory errors.

In some examples, various command signaling from the host device may elicit different current demands. The voltage may respond to the different current demands by oscillating between high and low voltages. Identifying and correlating the voltage response to the current demand, and in some cases to the command signaling, may help mitigate voltage droop issues before they occur. In some examples, the periodic demand of the current, may cause the voltage to oscillate which may cause jitter, and/or issues with the timing needs of the memory die which may be problematic. Thus, minimizing oscillations may ensure that commands may be performed at the correct timing by the memory die.

In some examples, issues may be identified by monitoring the resonance for a time duration or a period of time. Additionally, the quantity of periodic oscillations that occur over a duration of time may be another indicator of a voltage droop issue and it may be used to identify a problematic voltage oscillation before reaching the resonance frequency.

In some examples, a correlation may be determined by taking the Fourier Transform of the signal to identify patterns and to identify peaks in the spectrum. As the voltage continues to oscillate, peaks in the spectrum may indicate that the voltage will drop below the desired operating voltage range. By identifying the pattern and/or spectrum peaks, the voltage droop issue may be mitigated before dropping below the voltage specification range by performing a corrective action.

In some examples, a sensing element or sensor may sense the on-die voltage and the spectrum of the signal may then be dynamically calculated on the fly. In some examples, an on-die oscilloscope capable of reading transient waveforms may provide frequency spectrum information. A predetermined lookup table may be utilized to identify and compare the calculated spectrum to the predetermined spectrum (e.g., the resonance frequency) that may cause issues. In some examples, if the spectrum has some minimum quantity of tones in a region or if a tone may exceed a predetermined value, then a corrective action may be performed to mitigate issues before they occur. In some examples, the sensor may be located as close to the memory die as possible to monitor the on-die voltage.

In some examples, through spectrum analysis or through a feedback mechanism such as monitoring the voltage, the corrective action of spacing out the operations may mitigate an issue from occurring. Additionally, any appropriate corrective action that may break the oscillation pattern and/or manipulate the current demand, or any combination of appropriate corrective actions may be employed. In some examples, additional capacitors may be dynamically enabled to mitigate the resonance.

Figure 5:
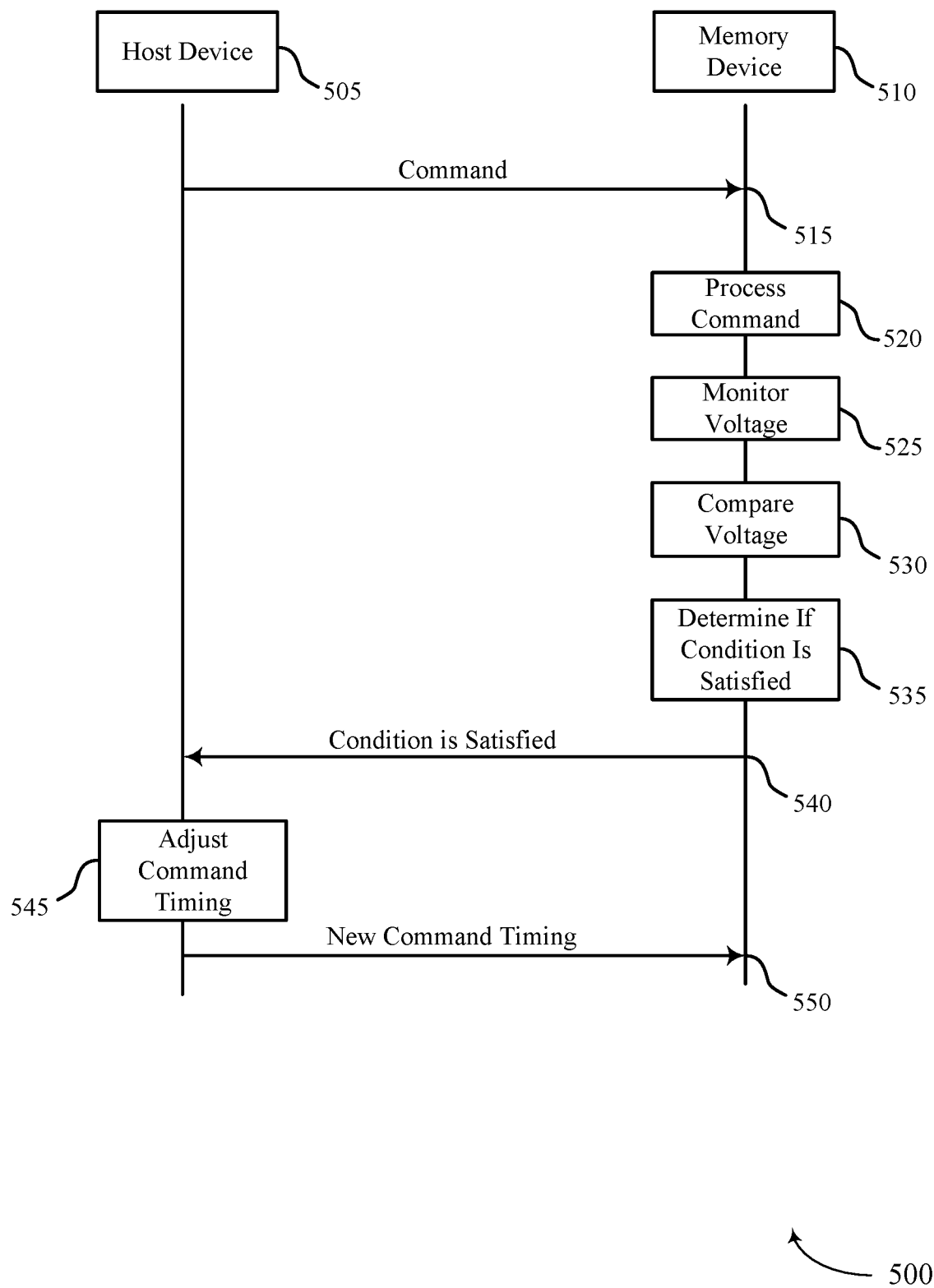
FIG. 5 illustrates an example of a process flow that supports predictive power management in accordance with examples as disclosed herein.

FIG. 5 illustrates an example of a process flow 500 that supports predictive power management for a memory device in accordance with examples as disclosed herein. The process flow 500 may illustrate functions of and communications between a host device 505 and a memory device 510. In some examples, the memory device 510 which may be examples of the memory devices 110 or memory die 200 described with reference to FIGS. 1 and 2. The process flow 500 illustrates an on-die implementation that supports predictive power management.

In some examples, at 515 the host device 505 may transmit command signaling to the memory device 510. The command signaling may be functions such as, but not limited, read or sense commands, write commands, refresh commands, and so forth, and any combination thereof.

At 520, the memory device 510 may receive the command signaling from host device 505, and the memory device 510 may process the received command signaling. The memory device may process the command by performing the appropriate functions (e.g., performing a read command). A current demand may be employed to perform the received command. Thus a resulting voltage may be used to perform commands on the memory device 510.

At 525, the memory device 510 may monitor one or more voltages of the power delivery network associated with the memory die and/or memory device 510. The one or more voltages may be monitored using a sensing element or a sensor which may be located as close as possible to the memory die.

At 530, the one or more voltages may be compared with a set of voltages of the power delivery network. The set of voltages may be indicative of the power delivery network operating at a first frequency, which in some examples, may be an undesirable resonant frequency. In some examples, prior to the memory device 510 receiving a command from the host device 505, a set of voltages of the power delivery network may be identified. The set of voltages may be indicative of the power delivery network operating at first frequency, which may be a resonance frequency. The set of voltages may be identified by modeling the power delivery network as described with reference to FIGS. 3 and 4. By identifying the set of voltages indicative of operating at a resonance frequency, the command signaling may be changed before the power delivery network reaches the resonance frequency.

At 535, memory device 510 may determine whether the one or more voltages of the power delivery network satisfy a condition. In some examples, the condition may be whether the one or more voltages establish a predetermined pattern indicative of operating at a resonance frequency or are operating for a time duration at or around the resonance frequency. In some examples, the condition may be whether the one or more voltages are below a predetermined or threshold voltage which may be a droop voltage that is beyond the operating voltage specification range of the memory die. In some examples, the determination may be made based at least partially on comparing the one or more voltages to the set of voltages. In some examples, the determination of whether the one or more voltages satisfy the condition may occur before the power delivery network operates at a resonance frequency.

Additionally, in some examples, whether the one or more voltages satisfy the condition may be determined by monitoring transient waveforms via an on-die component. The on-die component may be an oscilloscope and may provide frequency spectrum information for identifying the resonance frequency. In some examples, whether the one or more voltages satisfy the condition may be determined by monitoring frequency spectrum information associated with the one or more voltages using one or more transient waveforms. In some examples, on-die component may provide frequency spectrum information for identifying the resonance frequency. Additionally, in some examples, whether the one or more voltages satisfy the condition may be determined by identifying a quantity of oscillation periods associated with the one or more voltages. A quantity of oscillations may be determined to be indicative of the resonance frequency, thus, by identifying the voltage oscillation period, the resonance frequency of the power delivery network may be mitigated before it occurs.

In some examples, when the condition is determined to be satisfied, one or more additional capacitors on the PCB may be enabled to change and lower the impedance associated with the memory die. The one or more capacitors may be coupled with the power delivery network based on whether the condition is satisfied. By enabling the additional capacitors, the first frequency or resonance frequency of the power delivery network may be mitigated before it occurs. In some examples, the condition may be one or more of operating at a resonance frequency for a duration, a droop threshold associated with the one or more voltages, or a set of predetermined voltages associated with operating the resonance frequency, or any combination thereof.

At 540, signaling or an indication from the memory device 510 may be transmitted to the host device 505 which indicates that the condition is satisfied. At 545, the timing of at least one command associated with the memory device 510 and/or memory die, may be adjusted at or by the host device 505. By adjusting the timing of the command, the commands may be spaced out so that the current demand may prevent an undesirable oscillating voltage which may be at the resonance frequency. At 550, the new timing of the command may be transmitted from the host device 505 to the memory device 510. The new timing of the command may be received from the host device 505 and may be control information that includes the timing for the command. The timing of the command may be different than a previous timing associated with the command. If the previous timing is performed, it may cause a current demand that may cause undesirable voltage oscillations resulting in voltage droop. In contrast, the new timing may mitigate current demands, voltage oscillations, or voltage droop, or combinations thereof.

In some examples, a timing of commands may be identified that may cause the power delivery network to operate at the first frequency, which may be the resonance frequency. The identification of the undesirable timing of commands may be performed prior to the resonance frequency occurring so that the timing of commands may be identified and mitigated before the power delivery network operates at the resonance frequency. Further, a quantity of oscillation periods may be identified, in which the different minimum value associated with each of the oscillation periods corresponds to voltages that are approaching the condition with each oscillation period. By identifying the quantity of oscillation periods, the voltage trend towards an undesirable condition may be identified before it occurs, and a corrective action may be performed.

Figure 6:
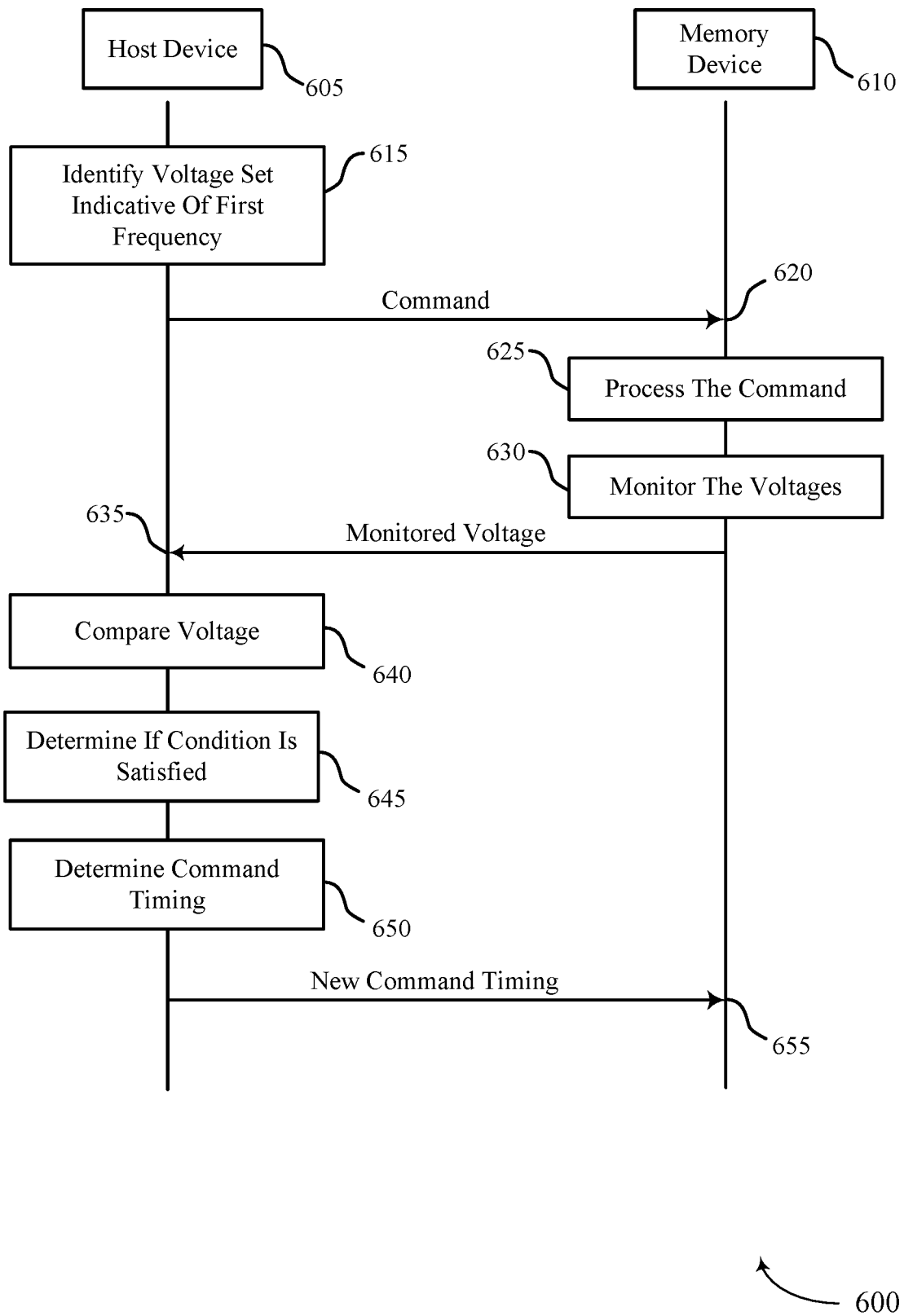
FIG. 6 illustrates an example of a process flow that supports predictive power management in accordance with examples as disclosed herein.

FIG. 6 illustrates an example of a process flow 600 that supports predictive power management for a memory device in accordance with examples as disclosed herein. The process flow 600 may illustrate functions of and communications between a host device 605 and a memory device 610. In some examples, the memory device 610 which may be examples of the memory devices 110 or memory die 200 described with reference to FIGS. 1 and 2. The process flow 600 illustrates a host device implementation that supports predictive power management.

As illustrated in FIG. 6, at 615, the host device 605 may identify a set of voltages that may be indicative of the memory device 610 operating at or near a first frequency, which may be a resonance frequency. Additionally, the set of voltages may be an oscillating set of voltages that establish a periodic pattern trending toward a droop voltage which may cause the memory device 610 to operate sub-optimally.

In some examples, at 620 the host device 605 may transmit command signaling to the memory device 610. The command signaling may be functions such as, but not limited, read or sense commands, write commands, refresh commands, and so forth, and any combination thereof.

The memory device 610 may receive the command signaling from host device 605 and at 625, the memory device 610 may process the received command signaling. At 625 the memory device 610 may process the command by performing the appropriate functions (e.g., performing a read command). A current demand may be employed to perform the received command. Thus a resulting voltage may be used to perform commands on the memory device 610.

At 630, one or more voltage may be monitored at the memory die. The voltages may be monitored by a sensing element and/or a sensor and the sensor may be located as close as practicable to the memory die. The monitored voltages may be transmitted from the memory device 610 at 635. Accordingly, the host device 605 may receive one or more voltages of the power delivery network that are associated with a memory die.

At 640, one or more voltages may be compared with a set of voltages of the power delivery network. The set of voltages may be indicative of the power delivery network operating at a first frequency, which in some examples, may be an undesirable resonance frequency.

At 645, host device 605 may determine whether the one or more voltages of the power delivery network satisfy a condition. In some examples, the condition may be whether the one or more voltages establish a predetermined pattern indicative of operating at a resonant frequency. In some examples, the condition may be whether the one or more voltages are below a predetermined voltage which may be a droop voltage that is beyond the operating voltage specification range. In some examples, the determination may be made based at least partially on comparing the monitored one or more voltages to the set of voltages. In some examples, the condition may be one or more of operating at a resonance frequency for a duration, a droop threshold associated with the one or more voltages, or a set of predetermined voltages associated with operating the resonance frequency, or any combination thereof.

At 650, the timing of at least one command associated with the memory device 610 and/or memory die, may be determined at the host device 605. By determining and adjusting the timing of the command, the commands may be spaced out so that the current demand may be prevent an undesirable oscillating voltage which may be at the resonance frequency. At 655, the new timing of the command may be transmitted from the host device 605 and to the memory device 610. Additionally, the timing of the command may be based on whether the one or more voltages satisfied the condition as described herein. In some examples, a correlation may be identified between a previous timing of commands and receiving the indication, in which the determination of the timing may be at least partially based on identifying this correlation.

Figure 7:
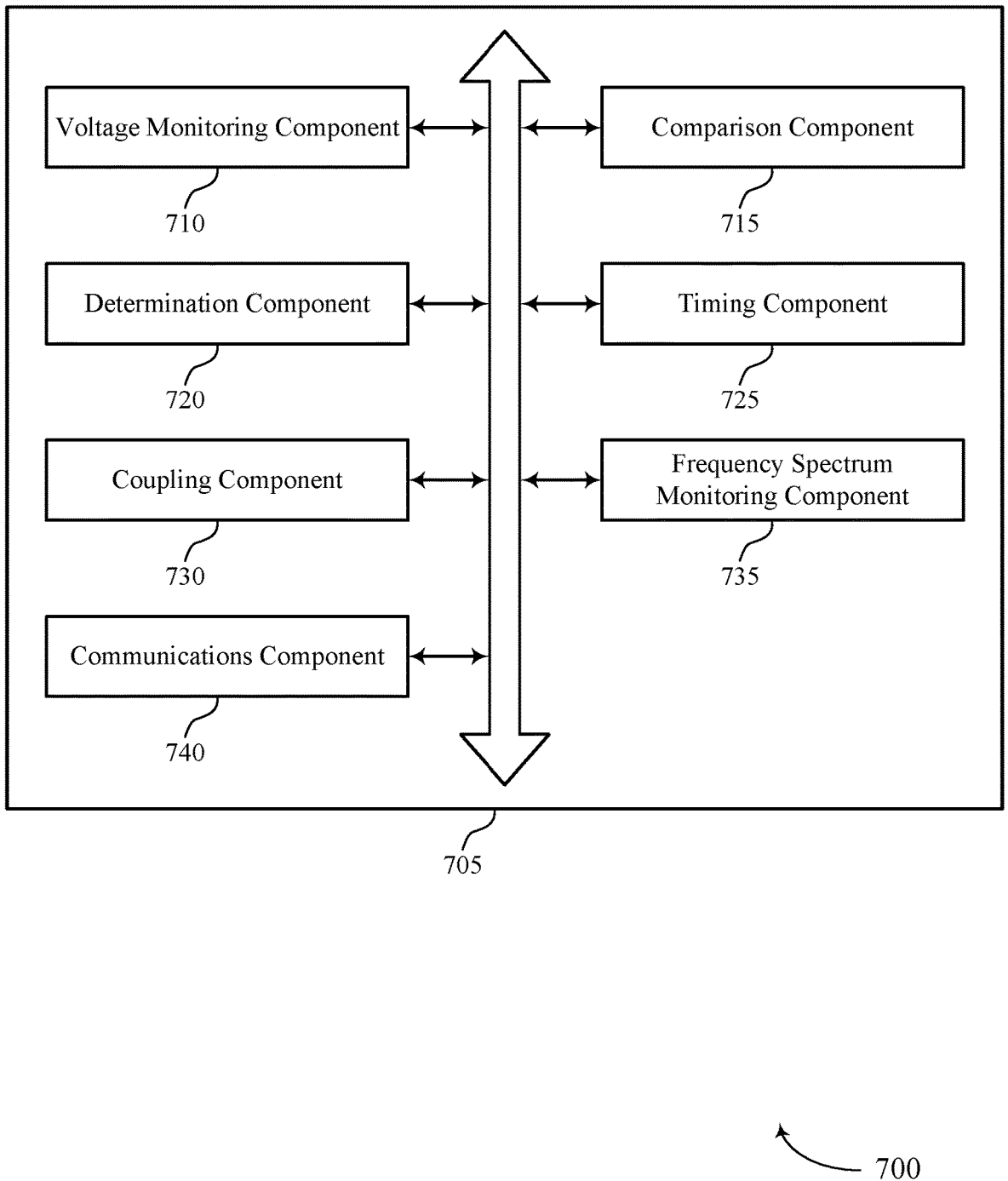
FIG. 7 illustrates an examples of a memory device that supports predictive power management in accordance with examples as disclosed herein.

FIG. 7 shows a block diagram 700 of a memory device 705 that supports predictive power management in accordance with examples as disclosed herein. The memory device 705 may be an example of aspects of a memory device as described with reference to FIGS. 1-6. The memory device 705 may include a voltage monitoring component 710, a comparison component 715, a determination component 720, a timing component 725, a coupling component 730, a frequency spectrum monitoring component 735, and a communications component 740. Each of these modules may communicate, directly or indirectly, with one another (e.g., via one or more buses).

The voltage monitoring component 710 may monitor one or more voltages of a power delivery network associated with a memory die. In some cases, the power delivery network includes one or more voltage rails coupled with an array of memory cells and configured to deliver power to the array of memory cells.

The comparison component 715 may compare the one or more voltages with a set of voltages of the power delivery network indicative of the power delivery network operating at a first frequency. In some examples, the comparison component 715 may identify the set of voltages of the power delivery network indicative of the power delivery network operating at the first frequency, where comparing the one or more voltages with the set of voltages is based on identifying the set of voltages. In some examples, determining whether the one or more voltages satisfy the condition occurs before the power delivery network operates at a resonance frequency, where the first frequency includes the resonance frequency.

In some examples, the comparison component 715 may determine that a voltage of the one or more voltages drops below a threshold, where adjusting the timing is based on determining that the voltage drops below the threshold. In some cases, the condition includes operating at a resonance frequency for a duration, a droop threshold associated with the one or more voltages, or a set of predetermined voltages associated with operating the resonance frequency, or a combination thereof.

The determination component 720 may determine whether the one or more voltages of the power delivery network satisfy a condition based on comparing the one or more voltages with the set of voltages. In some examples, determining whether the power delivery network operates at a resonance frequency for a duration based on the one or more voltages, where the first frequency includes the resonance frequency. In some examples, the determination component 720 may identify a quantity of oscillation periods associated with the one or more voltages.

The timing component 725 may adjust a timing of at least one command associated with the memory die based on determining whether the one or more voltages satisfy the condition. In some examples, the timing component 725 may identify a timing of commands that causes the power delivery network to operate at the first frequency, where determining that the one or more voltages satisfy the condition is based on identifying the timing of commands.

The coupling component 730 may couple at least one additional capacitor with the power delivery network based on determining whether the one or more voltages satisfy the condition.

The frequency spectrum monitoring component 735 may monitor frequency spectrum information associated with the one or more voltages using one or more transient waveforms.

The communications component 740 may receive, from a host device, control information that includes the timing for the at least one command, the timing being different than a previous timing associated with the at least one command, where adjusting the timing is based on receiving the control information. In some examples, the communications component 740 may transmit, to a host device, an indication that the one or more voltages satisfy the condition. In some examples, the communications component 740 may receive, from the host device, control information that includes the timing for the at least one command based on transmitting the indication, where adjusting the timing is based on receiving the control information.

Figure 8:
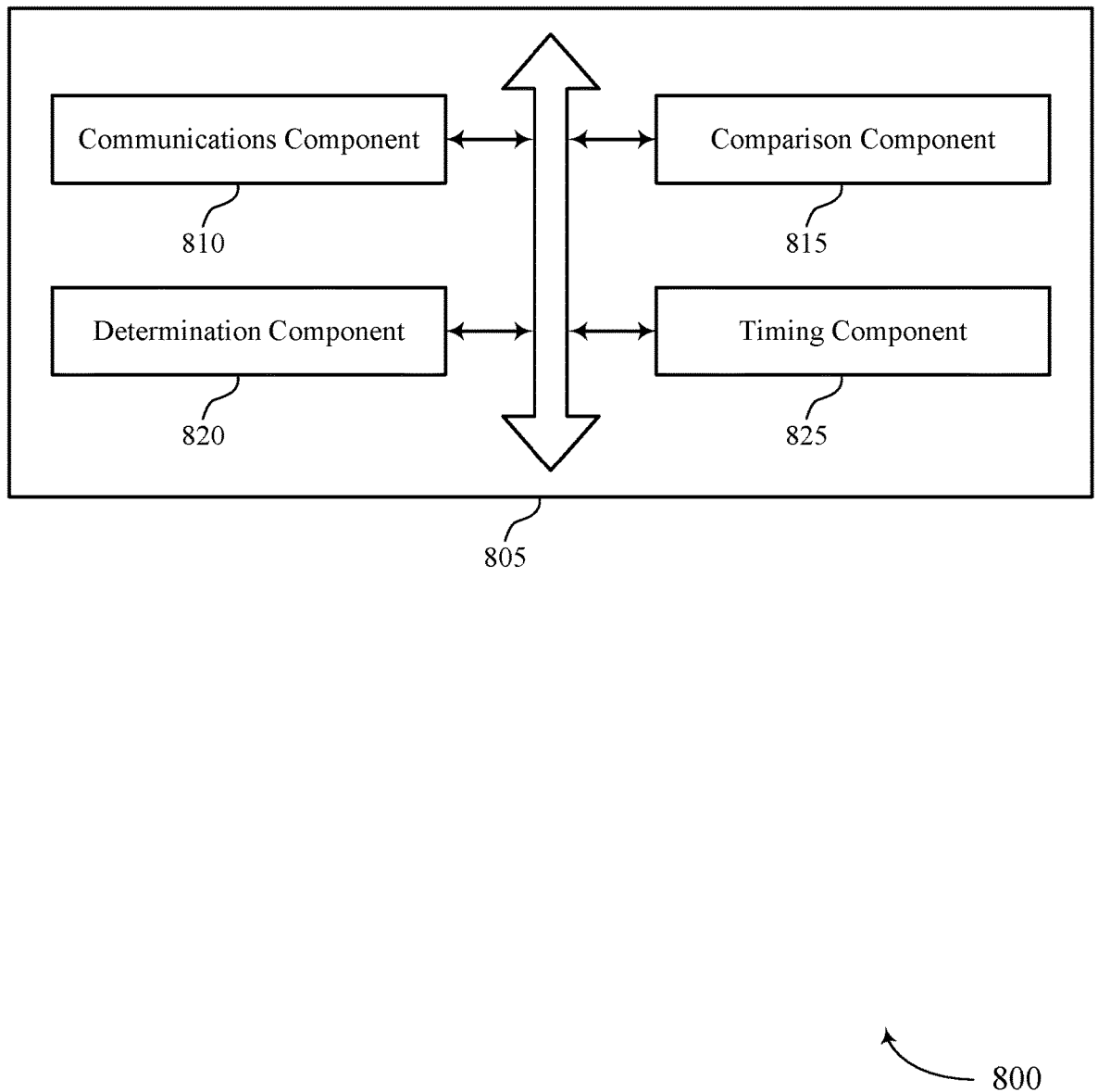
FIG. 8 shows a block diagram of a host device that supports predictive power management in accordance with aspects of the present disclosure.

FIG. 8 shows a block diagram 800 of a host device 805 that supports predictive power management in accordance with examples as disclosed herein. The host device 805 may be an example of aspects of a host device as described with reference to FIGS. 1-6. The host device 805 may include a communications component 810, a comparison component 815, a determination component 820, and a timing component 825. Each of these modules may communicate, directly or indirectly, with one another (e.g., via one or more buses).

The communications component 810 may receive, at a host device, one or more voltages of a power delivery network that are associated with a memory die. In some examples, the communications component 810 may transmit, to the memory die based on determining the timing of at least one command, the timing of at least one command associated with the memory die.

In some examples, the communications component 810 may receive, at a host device, an indication that one or more voltages of a power delivery network on a memory die are configured to cause the power delivery network to operate at a resonance frequency for a duration. In some examples, the communications component 810 may transmit the timing of the at least one command. In some examples, the communications component 810 may transmit the at least one command with the timing determined based on receiving the indication.

The comparison component 815 may compare the one or more voltages with a set of voltages of the power delivery network indicative of the power delivery network operating at a first frequency. In some examples, the comparison component 815 may identify the set of voltages of the power delivery network indicative of the power delivery network operating at the first frequency, where comparing the one or more voltages with the set of voltages is based on identifying the set of voltages. In some examples, the comparison component 815 may determine that a voltage of the one or more voltages drops below a threshold, where adjusting the timing is based on determining that the voltage drops below the threshold.

The determination component 820 may determine whether the one or more voltages of the power delivery network satisfy a condition based on comparing the one or more voltages with the set of voltages. In some examples, the determination component 820 may determine a timing of at least one command based on the receiving the indication. In some examples, determining whether the power delivery network operates at a resonance frequency for a duration based on the one or more voltages, where the first frequency includes the resonance frequency.

The timing component 825 may determine a timing of at least one command associated with the memory die based on determining whether the one or more voltages satisfy the condition. In some examples, the timing component 825 may identify a timing of commands that causes the power delivery network to operate at the first frequency, where determining that the one or more voltages satisfy the condition is based on identifying the timing of commands.

In some examples, the timing component 825 may identify a previous timing of the at least one command based on determining whether the one or more voltages satisfy the condition, where the timing is different than the previous timing. In some examples, the timing component 825 may identify a correlation between a previous timing of the at least one command and receiving the indication, where determining the timing is based on identifying the correlation.

Figure 9:
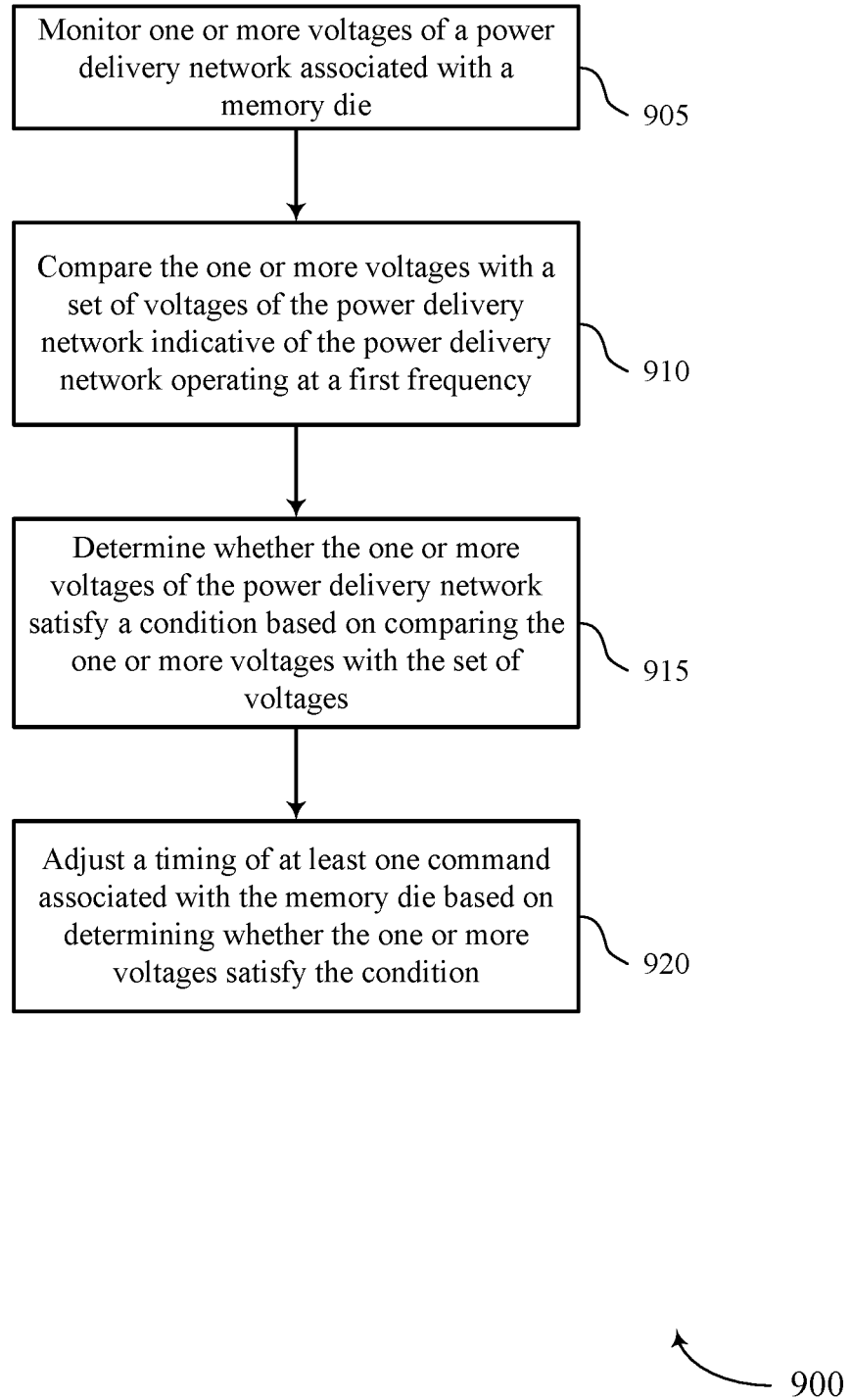
FIGS. 9 through 12 show flowcharts illustrating a method or methods that support predictive power management in accordance with examples as disclosed herein.

FIG. 9 shows a flowchart illustrating a method or methods 900 that supports predictive power management in accordance with aspects of the present disclosure. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may monitor one or more voltages of a power delivery network associated with a memory die. The operations of 905 may be performed according to the methods described herein. In some examples, aspects of the operations of 905 may be performed by a voltage monitoring component as described with reference to FIG. 7.

At 910, the memory device may compare the one or more voltages with a set of voltages of the power delivery network indicative of the power delivery network operating at a first frequency. The operations of 910 may be performed according to the methods described herein. In some examples, aspects of the operations of 910 may be performed by a comparison component as described with reference to FIG. 7.

At 915, the memory device may determine whether the one or more voltages of the power delivery network satisfy a condition based on comparing the one or more voltages with the set of voltages. The operations of 915 may be performed according to the methods described herein. In some examples, aspects of the operations of 915 may be performed by a determination component as described with reference to FIG. 7.

At 920, the memory device may adjust a timing of at least one command associated with the memory die based on determining whether the one or more voltages satisfy the condition. The operations of 920 may be performed according to the methods described herein. In some examples, aspects of the operations of 920 may be performed by a timing component as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for monitoring one or more voltages of a power delivery network associated with a memory die, comparing the one or more voltages with a set of voltages of the power delivery network indicative of the power delivery network operating at a first frequency, determining whether the one or more voltages of the power delivery network satisfy a condition based on comparing the one or more voltages with the set of voltages, and adjusting a timing of at least one command associated with the memory die based on determining whether the one or more voltages satisfy the condition.

Some examples of the method 900 and the apparatus described herein may further include operations, features, means, or instructions for identifying the set of voltages of the power delivery network indicative of the power delivery network operating at the first frequency, where comparing the one or more voltages with the set of voltages may be based on identifying the set of voltages.

Some examples of the method 900 and the apparatus described herein may further include operations, features, means, or instructions for coupling at least one additional capacitor with the power delivery network based on determining whether the one or more voltages satisfy the condition.

Some examples of the method 900 and the apparatus described herein may further include operations, features, means, or instructions for determining whether the one or more voltages satisfy the condition occurs before the power delivery network operates at a resonance frequency, where the first frequency includes the resonance frequency.

In some examples of the method 900 and the apparatus described herein, determining whether the one or more voltages satisfy the condition further may include operations, features, means, or instructions for monitoring frequency spectrum information associated with the one or more voltages using one or more transient waveforms.

Some examples of the method 900 and the apparatus described herein may further include operations, features, means, or instructions for determining that a voltage of the one or more voltages drops below a threshold, where adjusting the timing may be based on determining that the voltage drops below the threshold.

In some examples of the method 900 and the apparatus described herein, determining whether the one or more voltages satisfy the condition further may include operations, features, means, or instructions for determining whether the power delivery network operates at a resonance frequency for a duration based on the one or more voltages, where the first frequency includes the resonance frequency.

Some examples of the method 900 and the apparatus described herein may further include operations, features, means, or instructions for receiving, from a host device, control information that includes the timing for the at least one command, the timing being different than a previous timing associated with the at least one command, where adjusting the timing may be based on receiving the control information.

Some examples of the method 900 and the apparatus described herein may further include operations, features, means, or instructions for transmitting, to a host device, an indication that the one or more voltages satisfy the condition, and receiving, from the host device, control information that includes the timing for the at least one command based on transmitting the indication, where adjusting the timing may be based on receiving the control information.

Some examples of the method 900 and the apparatus described herein may further include operations, features, means, or instructions for identifying a timing of commands that causes the power delivery network to operate at the first frequency, where determining that the one or more voltages satisfy the condition may be based on identifying the timing of commands.

In some examples of the method 900 and the apparatus described herein, determining whether the one or more voltages satisfy the condition further may include operations, features, means, or instructions for identifying a quantity of oscillation periods associated with the one or more voltages.

In some examples of the method 900 and the apparatus described herein, the power delivery network includes one or more voltage rails coupled with an array of memory cells and configured to deliver power to the array of memory cells.

In some examples of the method 900 and the apparatus described herein, the condition includes operating at a resonance frequency for a duration, a droop threshold associated with the one or more voltages, or a set of predetermined voltages associated with operating the resonance frequency, or a combination thereof.

Figure 10:
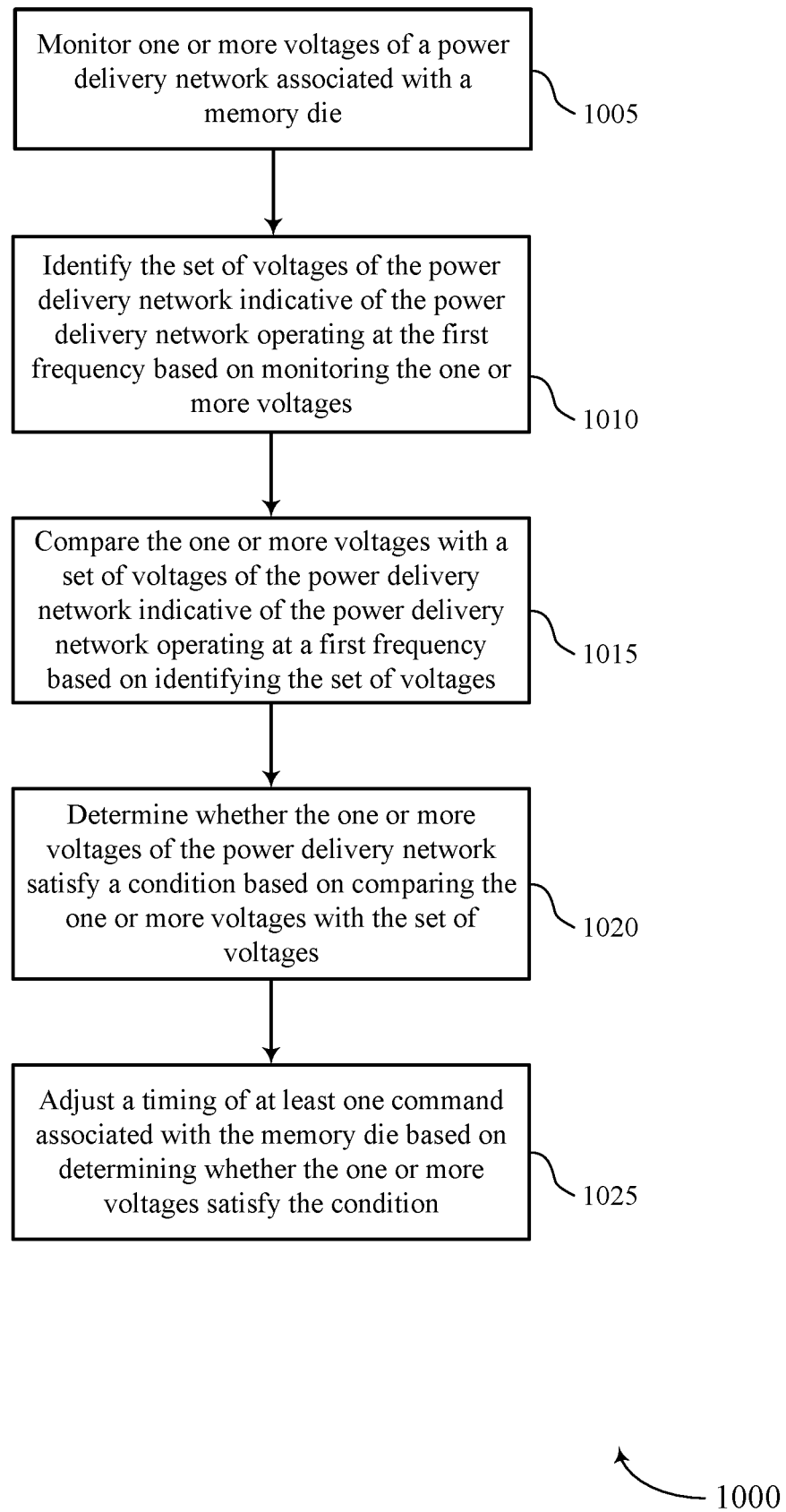

FIG. 10 shows a flowchart illustrating a method or methods 1000 that supports predictive power management in accordance with aspects of the present disclosure. The operations of method 1000 may be implemented by a memory device or its components as described herein. For example, the operations of method 1000 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1005, the memory device may monitor one or more voltages of a power delivery network associated with a memory die. The operations of 1005 may be performed according to the methods described herein. In some examples, aspects of the operations of 1005 may be performed by a voltage monitoring component as described with reference to FIG. 7.

At 1010, the memory device may identify the set of voltages of the power delivery network indicative of the power delivery network operating at the first frequency based on monitoring the one or more voltages. The operations of 1010 may be performed according to the methods described herein. In some examples, aspects of the operations of 1010 may be performed by a comparison component as described with reference to FIG. 7.

At 1015, the memory device may compare the one or more voltages with a set of voltages of the power delivery network indicative of the power delivery network operating at a first frequency based on identifying the set of voltages. The operations of 1015 may be performed according to the methods described herein. In some examples, aspects of the operations of 1015 may be performed by a comparison component as described with reference to FIG. 7.

At 1020, the memory device may determine whether the one or more voltages of the power delivery network satisfy a condition based on comparing the one or more voltages with the set of voltages. The operations of 1020 may be performed according to the methods described herein. In some examples, aspects of the operations of 1020 may be performed by a determination component as described with reference to FIG. 7.

At 1025, the memory device may adjust a timing of at least one command associated with the memory die based on determining whether the one or more voltages satisfy the condition. The operations of 1025 may be performed according to the methods described herein. In some examples, aspects of the operations of 1025 may be performed by a timing component as described with reference to FIG. 7.

Figure 11:
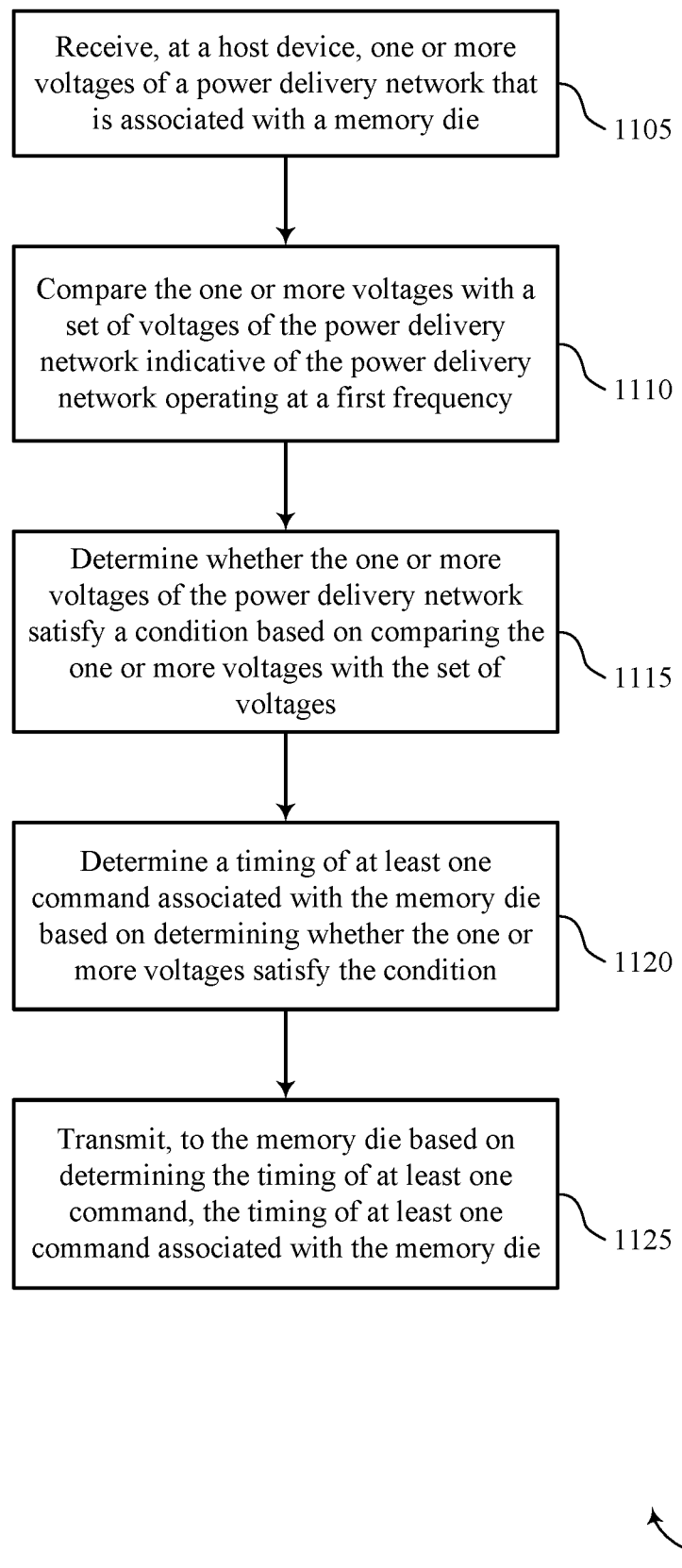

FIG. 11 shows a flowchart illustrating a method or methods 1100 that supports predictive power management in accordance with aspects of the present disclosure. The operations of method 1100 may be implemented by a host device or its components as described herein. For example, the operations of method 1100 may be performed by a host device as described with reference to FIG. 8. In some examples, a host device may execute a set of instructions to control the functional elements of the host device to perform the described functions. Additionally or alternatively, a host device may perform aspects of the described functions using special-purpose hardware.

At 1105, the host device may receive, at a host device, one or more voltages of a power delivery network that are associated with a memory die. The operations of 1105 may be performed according to the methods described herein. In some examples, aspects of the operations of 1105 may be performed by a communications component as described with reference to FIG. 8.

At 1110, the host device may compare the one or more voltages with a set of voltages of the power delivery network indicative of the power delivery network operating at a first frequency. The operations of 1110 may be performed according to the methods described herein. In some examples, aspects of the operations of 1110 may be performed by a comparison component as described with reference to FIG. 8.

At 1115, the host device may determine whether the one or more voltages of the power delivery network satisfy a condition based on comparing the one or more voltages with the set of voltages. The operations of 1115 may be performed according to the methods described herein. In some examples, aspects of the operations of 1115 may be performed by a determination component as described with reference to FIG. 8.

At 1120, the host device may determine a timing of at least one command associated with the memory die based on determining whether the one or more voltages satisfy the condition. The operations of 1120 may be performed according to the methods described herein. In some examples, aspects of the operations of 1120 may be performed by a timing component as described with reference to FIG. 8.

At 1125, the host device may transmit, to the memory die based on determining the timing of at least one command, the timing of at least one command associated with the memory die. The operations of 1125 may be performed according to the methods described herein. In some examples, aspects of the operations of 1125 may be performed by a communications component as described with reference to FIG. 8.

In some examples, an apparatus as described herein may perform a method or methods, such as the method 1100. The apparatus may include features, means, or instructions (e.g., a non-transitory computer-readable medium storing instructions executable by a processor) for receiving, at a host device, one or more voltages of a power delivery network that are associated with a memory die, comparing the one or more voltages with a set of voltages of the power delivery network indicative of the power delivery network operating at a first frequency, determining whether the one or more voltages of the power delivery network satisfy a condition based on comparing the one or more voltages with the set of voltages, determining a timing of at least one command associated with the memory die based on determining whether the one or more voltages satisfy the condition, and transmitting, to the memory die based on determining the timing of at least one command, the timing of at least one command associated with the memory die.

Some examples of the method 1100 and the apparatus described herein may further include operations, features, means, or instructions for identifying the set of voltages of the power delivery network indicative of the power delivery network operating at the first frequency, where comparing the one or more voltages with the set of voltages may be based on identifying the set of voltages.

Some examples of the method 1100 and the apparatus described herein may further include operations, features, means, or instructions for determining that a voltage of the one or more voltages drops below a threshold, where adjusting the timing may be based on determining that the voltage drops below the threshold.

In some examples of the method 1100 and the apparatus described herein, determining whether the one or more voltages satisfy the condition further may include operations, features, means, or instructions for determining whether the power delivery network operates at a resonance frequency for a duration based on the one or more voltages, where the first frequency includes the resonance frequency.

Some examples of the method 1100 and the apparatus described herein may further include operations, features, means, or instructions for identifying a timing of commands that causes the power delivery network to operate at the first frequency, where determining that the one or more voltages satisfy the condition may be based on identifying the timing of commands.

Some examples of the method 1100 and the apparatus described herein may further include operations, features, means, or instructions for identifying a previous timing of the at least one command based on determining whether the one or more voltages satisfy the condition, where the timing may be different than the previous timing.

Figure 12:
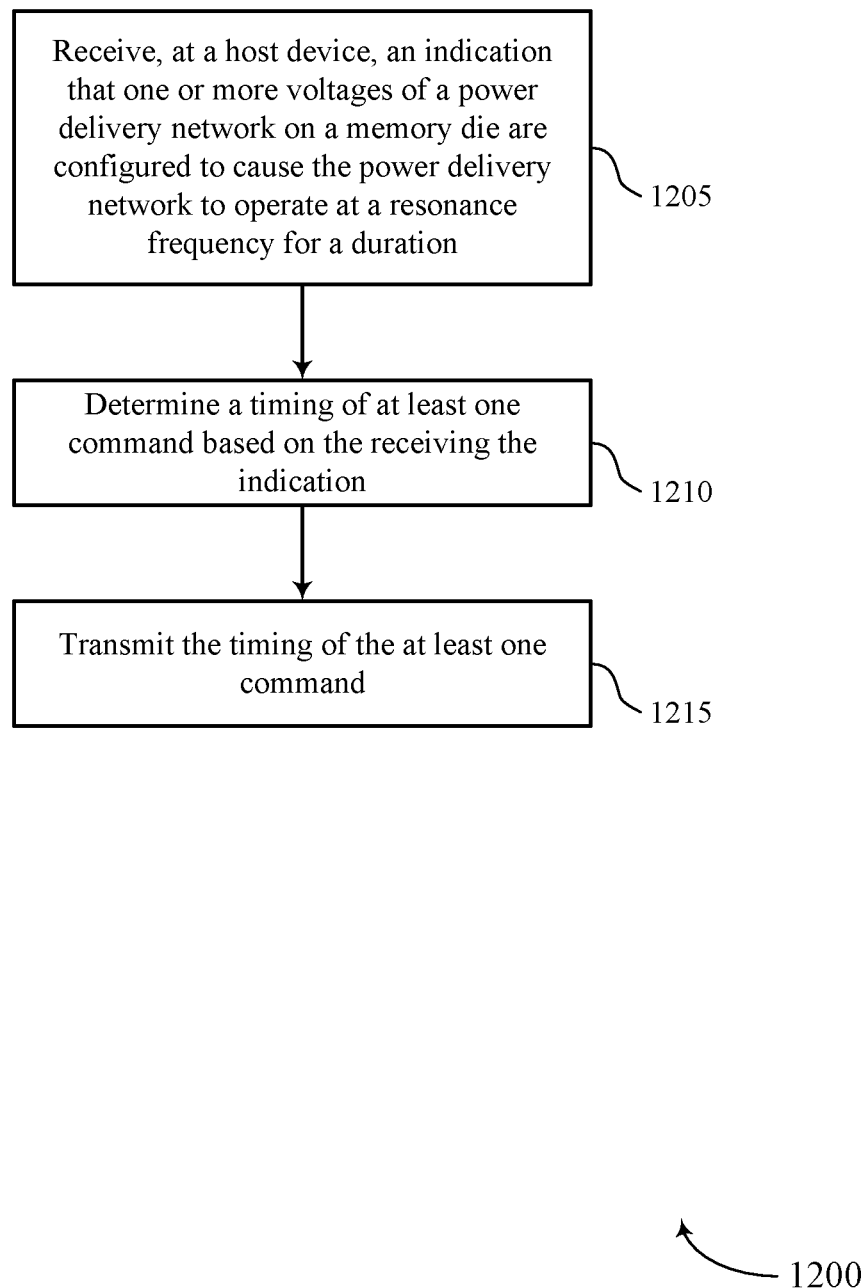

FIG. 12 shows a flowchart illustrating a method or methods 1200 that supports predictive power management in accordance with aspects of the present disclosure. The operations of method 1200 may be implemented by a host device or its components as described herein. For example, the operations of method 1200 may be performed by a host device as described with reference to FIG. 8. In some examples, a host device may execute a set of instructions to control the functional elements of the host device to perform the described functions. Additionally or alternatively, a host device may perform aspects of the described functions using special-purpose hardware.

At 1205, the host device may receive, at a host device, an indication that one or more voltages of a power delivery network on a memory die are configured to cause the power delivery network to operate at a resonance frequency for a duration. The operations of 1205 may be performed according to the methods described herein. In some examples, aspects of the operations of 1205 may be performed by a communications component as described with reference to FIG. 8.

At 1210, the host device may determine a timing of at least one command based on the receiving the indication. The operations of 1210 may be performed according to the methods described herein. In some examples, aspects of the operations of 1210 may be performed by a determination component as described with reference to FIG. 8.

At 1215, the host device may transmit the timing of the at least one command. The operations of 1215 may be performed according to the methods described herein. In some examples, aspects of the operations of 1215 may be performed by a communications component as described with reference to FIG. 8.

In some examples, an apparatus as described herein may perform a method or methods, such as the method 1200. The apparatus may include features, means, or instructions (e.g., a non-transitory computer-readable medium storing instructions executable by a processor) for receiving, at a host device, an indication that one or more voltages of a power delivery network on a memory die are configured to cause the power delivery network to operate at a resonance frequency for a duration, determining a timing of at least one command based on the receiving the indication, and transmitting the timing of the at least one command.

Some examples of the method 1200 and the apparatus described herein may further include operations, features, means, or instructions for identifying a correlation between a previous timing of the at least one command and receiving the indication, where determining the timing may be based on identifying the correlation.

In some examples of the method 1200 and the apparatus described herein, transmitting the at least one command further may include operations, features, means, or instructions for transmitting the at least one command with the timing determined based on receiving the indication.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include a memory die including one or more memory cells, a power delivery network coupled with the memory die and configured to power one or more operations of the memory die, a sensor configured to sense one or more voltages of the power delivery network associated with the memory die, and a controller configured to cause the apparatus to compare the one or more voltages with a set of voltages of the power delivery network indicative of the power delivery network operating at a first frequency, determine whether the one or more voltages of the power delivery network associated with the memory die satisfy a condition based at least in part on comparing the one or more voltages with the set of voltages, and adjust a timing of at least one command associated with the memory die based at least in part on determining whether the one or more voltages of the power delivery network satisfy the condition.

Some examples may further include determining that a voltage of the one or more voltages drops below a threshold, where adjusting the timing may be based on determining that the voltage drops below the threshold. Some examples may further include identifying a timing of commands that causes the power delivery network to operate at the first frequency, where determining that the one or more voltages satisfy the condition may be based on identifying the timing of commands.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

As used herein, the term "substantially" means that the modified characteristic (e.g., a verb or adjective modified by the term substantially) need not be absolute but is close enough to achieve the advantages of the characteristic.

The devices described herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor described herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   monitoring one or more voltages of a power delivery network, the one or more voltages associated with one or more operations for a memory die;
   comparing the one or more voltages with a set of voltages of the power delivery network indicative of the power delivery network operating at a first frequency;
   determining whether the one or more voltages of the power delivery network satisfy a condition based at least in part on comparing the one or more voltages with the set of voltages;
   adjusting a timing of at least one command of a plurality of commands from a previous timing to a second timing that is different than the previous timing and to operate the power delivery network at a second frequency different than the first frequency based at least in part on determining whether the one or more voltages satisfy the condition, the at least one command associated with at least one operation of the one or more operations for the memory die, wherein adjusting the timing of the at least one command adjusts a spacing between one or more commands of the plurality of commands; and
   operating the power delivery network at the second frequency different than the first frequency based at least in part on the adjusted timing of the at least one command.

2. The method of claim 1, further comprising:
   identifying the set of voltages of the power delivery network indicative of the power delivery network operating at the first frequency, wherein comparing the one or more voltages with the set of voltages is based at least in part on identifying the set of voltages.

3. The method of claim 2, further comprising:
   coupling at least one additional capacitor with the power delivery network based at least in part on determining whether the one or more voltages satisfy the condition.

4. The method of claim 1, wherein determining whether the one or more voltages satisfy the condition occurs before the power delivery network operates at a resonance frequency, wherein the first frequency comprises the resonance frequency.

5. The method of claim 1, wherein determining whether the one or more voltages satisfy the condition further comprises:
   monitoring frequency spectrum information associated with the one or more voltages using one or more transient waveforms.

6. The method of claim 1, further comprising:
   determining that a voltage of the one or more voltages drops below a threshold, wherein adjusting the timing is based at least in part on determining that the voltage drops below the threshold.

7. The method of claim 1, wherein determining whether the one or more voltages satisfy the condition further comprises:
   determining whether the power delivery network operates at a resonance frequency for a duration based at least in part on the one or more voltages, wherein the first frequency comprises the resonance frequency.

8. The method of claim 1, further comprising:
   receiving, from a host device, control information that includes the timing for the at least one command, the timing being different than the previous timing associated with the at least one command, wherein adjusting the timing is based at least in part on receiving the control information.

9. The method of claim 1, further comprising:
   transmitting, to a host device, an indication that the one or more voltages satisfy the condition; and
   receiving, from the host device, control information that includes the timing for the at least one command based at least in part on transmitting the indication, wherein adjusting the timing is based at least in part on receiving the control information.

10. The method of claim 1, further comprising:
    identifying a timing of commands that causes the power delivery network to operate at the first frequency, wherein determining that the one or more voltages satisfy the condition is based at least in part on identifying the timing of commands.

11. The method of claim 1, wherein determining whether the one or more voltages satisfy the condition further comprises:
    identifying a quantity of oscillation periods associated with the one or more voltages.

12. The method of claim 1, wherein the power delivery network comprises one or more voltage rails coupled with an array of memory cells and configured to deliver power to the array of memory cells.

13. The method of claim 1, wherein the condition comprises operating at a resonance frequency for a duration, a droop threshold associated with the one or more voltages, or a set of predetermined voltages associated with operating the resonance frequency, or a combination thereof.

14. A method, comprising:
    receiving, at a host device, one or more voltages of a power delivery network of a memory die, the one or more voltages associated with one or more operations for the memory die, wherein the host device is coupled with the memory die;
    comparing the one or more voltages with a set of voltages of the power delivery network indicative of the power delivery network operating at a first frequency;
    identifying, at the host device, a timing of commands that causes the power delivery network to operate at the first frequency;
    determining, at the host device, whether the one or more voltages of the power delivery network satisfy a condition based at least in part on identifying the timing of commands and comparing the one or more voltages with the set of voltages;

determining, at the host device, a timing of at least one command associated with at least one operation of the one or more operations for the memory die based at least in part on determining whether the one or more voltages satisfy the condition, the timing of the at least one command different than the timing of commands that causes the power delivery network to operate at the first frequency; and transmitting, to the memory die based at least in part on determining the timing of the at least one command, the timing of the at least one command.

15. The method of claim 14, further comprising:

identifying the set of voltages of the power delivery network indicative of the power delivery network operating at the first frequency, wherein comparing the one or more voltages with the set of voltages is based at least in part on identifying the set of voltages.

16. The method of claim 14, further comprising:

determining that a voltage of the one or more voltages drops below a threshold, wherein adjusting the timing is based at least in part on determining that the voltage drops below the threshold.

17. The method of claim 14, wherein determining whether the one or more voltages satisfy the condition further comprises:

determining whether the power delivery network operates at a resonance frequency for a duration based at least in part on the one or more voltages, wherein the first frequency comprises the resonance frequency.

18. The method of claim 14, further comprising:

identifying a previous timing of the at least one command based at least in part on determining whether the one or more voltages satisfy the condition, wherein the timing is different than the previous timing.

19. An apparatus, comprising:

a memory die comprising one or more memory cells;

a power delivery network coupled with the memory die and configured to power one or more operations of the memory die;

a sensor configured to sense one or more voltages of the power delivery network, the one or more voltages associated with the one or more operations for the memory die; and a controller configured to cause the apparatus to:

compare the one or more voltages with a set of voltages of the power delivery network indicative of the power delivery network operating at a first frequency;

determine whether the one or more voltages of the power delivery network associated with the memory die satisfy a condition based at least in part on comparing the one or more voltages with the set of voltages;

adjust a timing of at least one command of a plurality of commands from a previous timing to a second timing that is different than the previous timing and to operate the power delivery network at a second frequency different than the first frequency based at least in part on determining whether the one or more voltages satisfy the condition, the at least one command associated with at least one operation of the one or more operations for the memory die, wherein adjusting the timing of the at least one command adjusts a spacing between one or more commands of the plurality of commands; and operate the power delivery network at the second frequency different than the first frequency based at least in part on the adjusted timing of the at least one command.

20. The apparatus of claim 19, wherein the controller is configured to cause the apparatus to:

determine that a voltage of the one or more voltages drops below a threshold, wherein adjusting the timing is based at least in part on determining that the voltage drops below the threshold.

21. The apparatus of claim 19, wherein the controller is configured to cause the apparatus to:

identify a timing of commands that causes the power delivery network to operate at the first frequency, wherein determining that the one or more voltages satisfy the condition is based at least in part on identifying the timing of commands.

* * * * *